United States Patent [19]
Logan et al.

[11] Patent Number: 5,191,506
[45] Date of Patent: Mar. 2, 1993

[54] CERAMIC ELECTROSTATIC CHUCK

[75] Inventors: Joseph S. Logan, Poughkeepsie; Raymond R. Ruckel, Garrison; Robert E. Tompkins, Pleasant Valley; Robert P. Westerfield, Jr., Montgomery, all of N.Y.

[73] Assignee: International Business Machines Corporation, Armonk, N.Y.

[21] Appl. No.: 694,699

[22] Filed: May 2, 1991

[51] Int. Cl.$^5$ .............................. H02N 13/00
[52] U.S. Cl. ........................ 361/234; 361/230; 269/8; 269/903; 279/128
[58] Field of Search .................... 361/230, 233, 234; 269/8, 903; 279/1 M, 128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,502,094 | 2/1985 | Lewin et al. | 361/234 |
| 4,554,611 | 11/1985 | Lewin | 361/234 |
| 4,645,218 | 2/1987 | Ooshio et al. | 279/1 M |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |
| 4,796,153 | 1/1989 | Amason et al. | 361/218 |
| 4,897,171 | 1/1990 | Ohmi | 204/290 |
| 4,962,441 | 10/1990 | Collins | 361/234 |
| 5,055,964 | 10/1991 | Logan et al. | 361/234 |

FOREIGN PATENT DOCUMENTS 1443215  7/1976  United Kingdom .

Primary Examiner—Jeffrey A. Gaffin
Attorney, Agent, or Firm—Richard A. Romanchik; Eric W. Petraske

[57] ABSTRACT

An electrostatic chuck 8 assembly includes, from top to bottom: a top multilayer ceramic insulating layer 10; an electrostatic pattern layer 12 having a conductive electrostatic pattern 16 disposed on a multilayer ceramic substrate; a multilayer ceramic support layer 20; and, a heat sink base 30 having a backside cooling channels machined therein. Layers 12, 12 and 20 are bonded together using multilayer ceramic techniques and the heatsink base 30 is brazed to the bottom of the multilayer ceramic support layer 20.

20 Claims, 3 Drawing Sheets

CERAMIC ELECTROSTATIC CHUCK

TECHNICAL FIELD

The present invention relates to chucks utilized for clamping wafers in the manufacture of semiconductors, and more particularly, a ceramic electrostatic chuck which is operable over a wide temperature range.

BACKGROUND ART

Electrostatic chucks are devices which have gained wide usage in the semiconductor field for clamping semiconductor wafers during manufacturing processes. These chucks eliminate the need for mechanical clamping mechanisms, which are often clumsy and induce contamination into the processing chambers. Typical electrostatic chucks utilized in the prior art can be found in U.S. Pat. Nos. 4,184,188 (Briglia); 4,384,918 (Abe); 4,724,510 (Wicker, et al.); and 4,665,463 (Ward, et al.).

Briglia discloses an electrostatic clamp having interdigitated, polarized electrodes disposed between layers of silicone rubber and supported by an aluminum plate which is attached to a water cooled base. The wafer under process sits on top of a layer of silicone rubber and is clamped by the electromagnetic field generated by the underlying electrodes. Briglia also discloses an alternative embodiment wherein aluminum electrodes are deposited onto an alumina support and insulated by oxidation. The electrode structure is secured "both mechanically and with good thermal conductivity" by a "water cooled plate".

Abe discloses an electrostatic chuck wherein aluminum clamping electrodes are insulated by either polytetrafluorethylene, polyethylene or silicon gum. The electrodes are, in turn supported by a water cooled support base, or a heated support base.

Wicker, et al. discloses an electrostatic chuck wherein the clamping electrodes are deposited on a semiconductor wafer and insulated by a layer of either CVD oxide, polyimide, or a suitable glass. The clamp is supported by "conductive support".

Ward, et al. discloses an electrostatic chuck wherein a center, circular clamping electrode is insulated by a layer of epoxy resin, such as Araldite loaded with particulate alumina or mica. The center electrode also serves as the heat sink for the wafer in process.

All of the above mentioned electrostatic chucks have insulated electrodes supported by an undefined cooling "support". A problem exists with these chucks and other known electrostatic chucks, however, in that the materials utilized for the electrical insulators have radically different thermal expansion characteristics than the materials utilized for the cooling supports. Therefore, subjecting these chucks to widely varying temperature cycles causes separation between the dissimilar materials. As a result, the chucks can only be utilized in very narrow temperature ranges, thereby limiting the application of each chuck to selective manufacturing processes. Even with this limitation, the chucks suffer from short lifetimes, low reliability and high costs. These problems are amplified because the chucks are a major cause of "down time" on the manufacturing line.

An electrostatic chuck which overcomes the above mentioned deficiencies is therefore, highly desirable.

DISCLOSURE OF THE INVENTION

An object of the present invention is to provide for an improved electrostatic chuck which can be utilized over widely varying temperature cycles.

Another object of the present invention is to provide for an improved electrostatic chuck which clamps wafers without having to make electrical contact to the wafers.

Another object of the present invention is to provide for an improved electrostatic chuck which has superior heat transfer capability.

According to the present invention, an improved electrostatic semiconductor chuck includes an electrically conductive electrostatic pattern disposed onto a multilayer ceramic (MLC) substrate which is bonded to a MLC support structure. A heat sink base supports the entire structure and a MLC isolation layer is placed on top of the electrostatic metal pattern to isolate the wafer from coming in contact with the metal pattern.

The present invention provides for a universal chuck which can be used in a wide variety of manufacturing processes having widely varying temperature ranges. It is light weight and easily manufacturable. In addition, the present invention can be manufactured within exceptional flatness specifications to thereby provide superior clamping force with minimal electrical energy.

These and other objects, features and advantages of the present invention will become more apparent in light of the detailed description of exemplary embodiments thereof as illustrated by the drawings.

BEST MODE FOR CARRYING OUT THE INVENTION

The present invention utilizes multilayer ceramic (MLC) packaging technology known in the prior art. Teachings for MLC technology may be found in commonly owned U.S. Pat. Nos. 3,518,756 (Bennett et al.), 3,838,204 (Ahn et al.), 4,080,414 (Anderson et al.), 4,234,367 (Herron et al.), 4,430,365 (Schaible et al.), 4,677,254 (Boss et al.), and 4,799,983 (Desai) which are incorporated herein by reference. These patents will collectively be referred to hereinafter as the "MLC patents".

Figure 1:
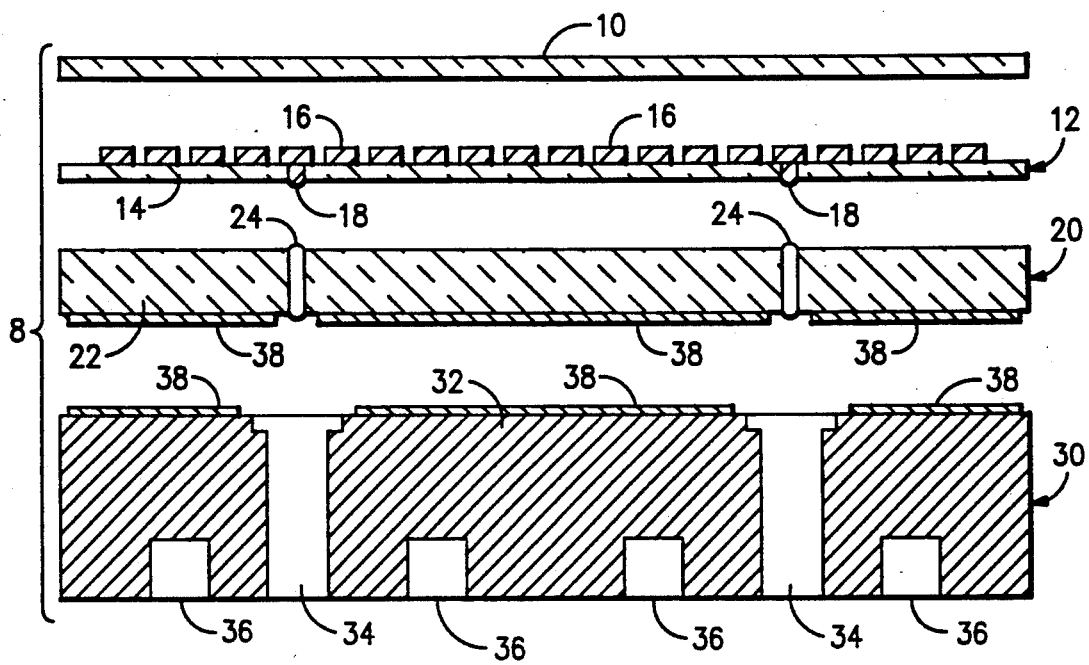
FIG. 1 is an exploded, cross-sectional view of a first embodiment of the electrostatic chuck of the present invention.

Referring now to FIG. 1, a first embodiment of the electrostatic chuck of the present invention includes a top isolation layer 10 to which the semiconductor wafer under process (not shown) is clamped.

The top isolation layer 10 is disposed on top of an electrostatic pattern layer 12, which is comprised of a multilayer ceramic (MLC) substrate 14 having an electrically conductive electrostatic pattern 16 disposed thereon. Metal vias or via lines 18 extend through the substrate 14 and provide a means for conducting electrical energy to the electrostatic pattern 16. The manufacture of substrate 14 is in accordance with the teachings of the aforementioned MLC patents. Briefly, structures 10, 14 and 20 are fabricated from a plurality of ceramic "green sheets" which are bonded together with heat and pressure. Each "green sheet" has a plurality of metal vias constructed therein. The result of the MLC fabrication is a relatively thin ceramic block or substrate 22 having metal vias 24 extending therethrough for conduction of electrical energy to the conductive pattern 16. It is to be noted that the MLC fabrication process produces slight over-extensions of the metal vias 18, 24 above the substrates 14, 22 and thereby provides a convenient means for interconnection between different sections 12, 20 and 30 of the present invention.

The electrostatic pattern 16 is comprised of two equal areas of electrically conductive material in a symmetrically distributed pattern. The pattern is formed by alternating conductive "strips" approximately 0.75 mm wide and spaced about 0.25 mm apart. Each alternately conductive "strip" is electrically energized with an opposite DC potential, thereby resulting in capacitance between the alternating conductive "strips". The conductive pattern 16 will be shown and described in greater detail hereinafter in FIG. 4. Teachings for forming the electrostatic pattern 16 on the multilayer ceramic substrate 14 may be found in Ahn et al. and Herron et al.

The preferred material for isolation layer 10 is MLC fabricated in accordance with the teachings of the aforementioned MLC patents. However, other electrically insulative, thermally conductive, dielectric materials with thermal-mechanical characteristics (i.e. thermal expansion rate and thermal conductivity) compatible with multilayer ceramic may be utilized. For example, these materials may include polyimide, alumina, quartz and diamond coating. The selection of the material utilized will of course be governed by the temperatures, etchants and processing environment to which the chuck will be exposed. There are two preferred ways to fabricate the isolation layer 10 if a material other than multilayer ceramic is used for the layer. The first method is to: bond a MLC substrate to the top of the electrostatic pattern layer 12 in a manner consistent with the MLC patents; and then bond the isolation layer 10 to the top of the MLC which is consequently covering the electrostatic pattern layer 12. The second method is to: bond a MLC substrate to the top of the electrostatic pattern layer 12 in a manner consistent with the MLC patents; then grind and lap the MLC substrate down to expose the electrostatic pattern 16 while leaving the areas between the conductive strips of the pattern filled in with ceramic; and then bond the isolation layer 10 to the top of the electrostatic pattern layer 20. These two methods of fabricating the isolation layer 10 should be completed at the very end of the fabrication of the chuck of the present invention, because of the elevated temperatures utilized to complete other portions of the chuck, as will be described in greater detail hereinafter.

It is to be noted that the thickness of the isolation layer 10 is dependent on two factors. First, the thickness must not be so great that unreasonably high voltages are needed to adequately clamp the wafer. In the preferred embodiment, the finished isolation layer 10 is about 0.05 mm thick. This particular thickness is achieved by grinding and lapping the layer after MLC processing. It has been found that impractical voltages are required to maintain adequate wafer clamping for isolation layer 10 thicknesses over 0.25 mm. Secondly, the thickness must be less than the spacing between the alternating conductive "strips", otherwise dielectric breakdown will occur between adjacent conductive strips of pattern 16 at voltages necessary to clamp the wafer.

The electrostatic pattern layer 12 is disposed on top of a MLC support 20, which is comprised of MLC material 22 fabricated in accordance with the aforementioned MLC patents. MLC support 20 has metal vias 24 disposed therethrough for conducting electrical energy to the metal vias 18 of the electrostatic pattern layer 12.

The MLC support 20 is disposed on top of a heat sink base 30, which is comprised of a thermally conductive block or substrate 32, having clearance holes 34 extending therethrough for facilitating electrical contact with the metal vias 24 of MLC support 20 from the bottom of base 30. Heat sink base 30 also has channels 36 provided therein for circulating a cooling fluid in order to transfer heat away from the chuck 8.

The material selection for the heat sink base 30 is critical, because it must match the thermal expansion rate of the MLC substrates 22, 14 and 10. Kovar, an iron/nickel/cobalt alloy (29Ni/17Co/53Fe), is the preferred material to be utilized for this purpose because its thermal expansion characteristics match that of MLC structures, and because it is a good thermal conductor. Kovar is a registered trademark of the Westinghouse Electric Co.

Isolation layer 10, electrostatic pattern layer 12 and support 20 are bonded together in accordance with the teachings of the aforementioned MLC patents. In the preferred embodiment, prior to bonding, the isolation layer 10 is about 0.28 mm thick, the electrostatic pattern layer 12 is 0.28 mm thick and the MLC support is about 1.50 mm thick. These layers will subsequently shrink in size during the MLC processing.

Brazing is the preferable method of bonding the heat sink 30 to the bottom of the support 20, by depositing gold contact pads 38 on the respective bonding surfaces, fitting the pieces together, and heating the assembly in a brazing furnace at approximately 850 degrees C for about 30 minutes. Sections 10, 12 and 20 must be bonded together before the support 20 is brazed to the heat sink 30. It is to be noted that other techniques can be utilized to bond or attach the support 20 to the heat sink 30, but brazing has been found to provide superior thermal expansion and heat transfer characteristics.

Figure 2:
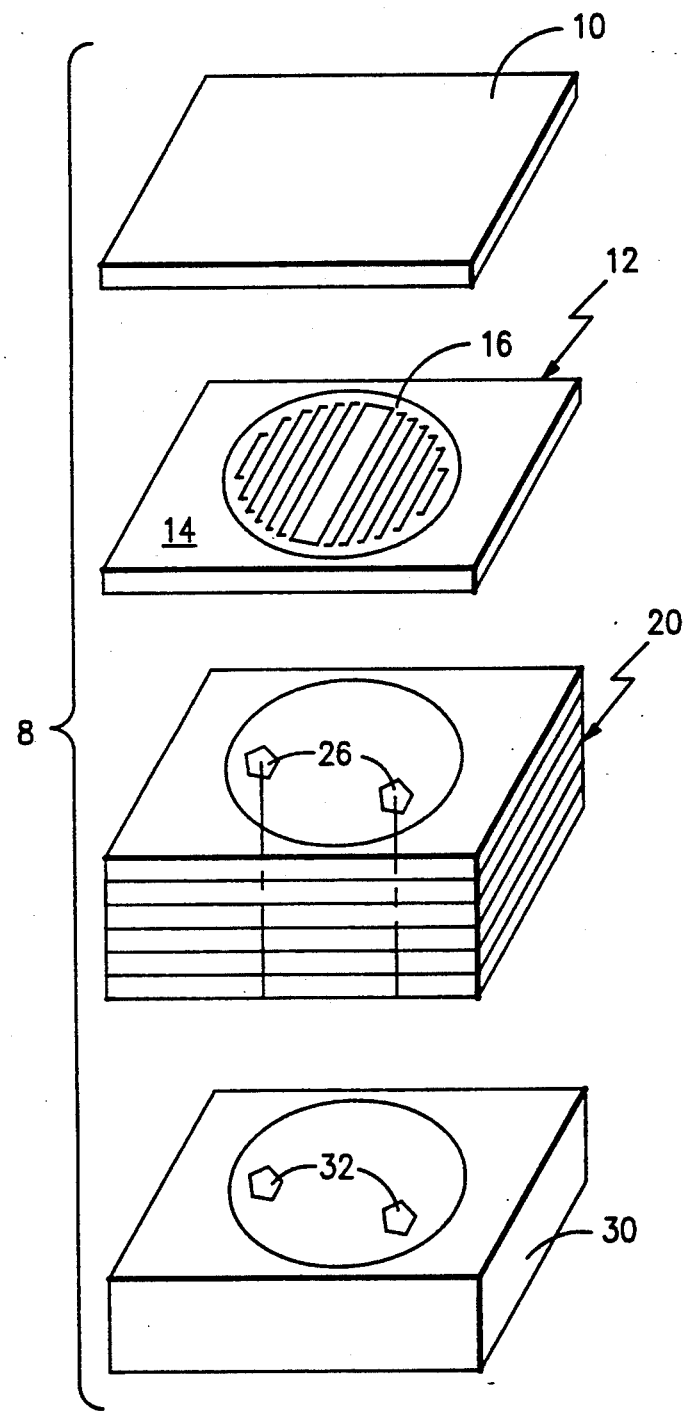
FIG. 2 is an exploded, perspective view of a first embodiment of the electrostatic chuck of the present invention.

Referring now to FIG. 2, the first embodiment of the electrostatic chuck of the present invention includes a top isolation layer 10, an electrostatic pattern layer 12, having an electrically conductive pattern 16 disposed thereon, a support 20, and a heat sink base 30. Metal via lines 18, 24 are disposed through layer 12 and support 20 for conducting electrical energy to the pattern 16. Heat sink base 30 has clearance holes 32 for facilitating electrical contact to via lines 24 from the bottom the base 30.

The structures in FIG. 2 have a square shape because the ceramic green sheets are square. However, it is to be noted that these structures may be constructed to have a different shape by machining or cutting before the aforementioned bonding and brazing steps. In particular, it may be desirable to form an electrostatic chuck which is circular in shape in order to match the shape of the wafers to be clamped.

Figure 3:
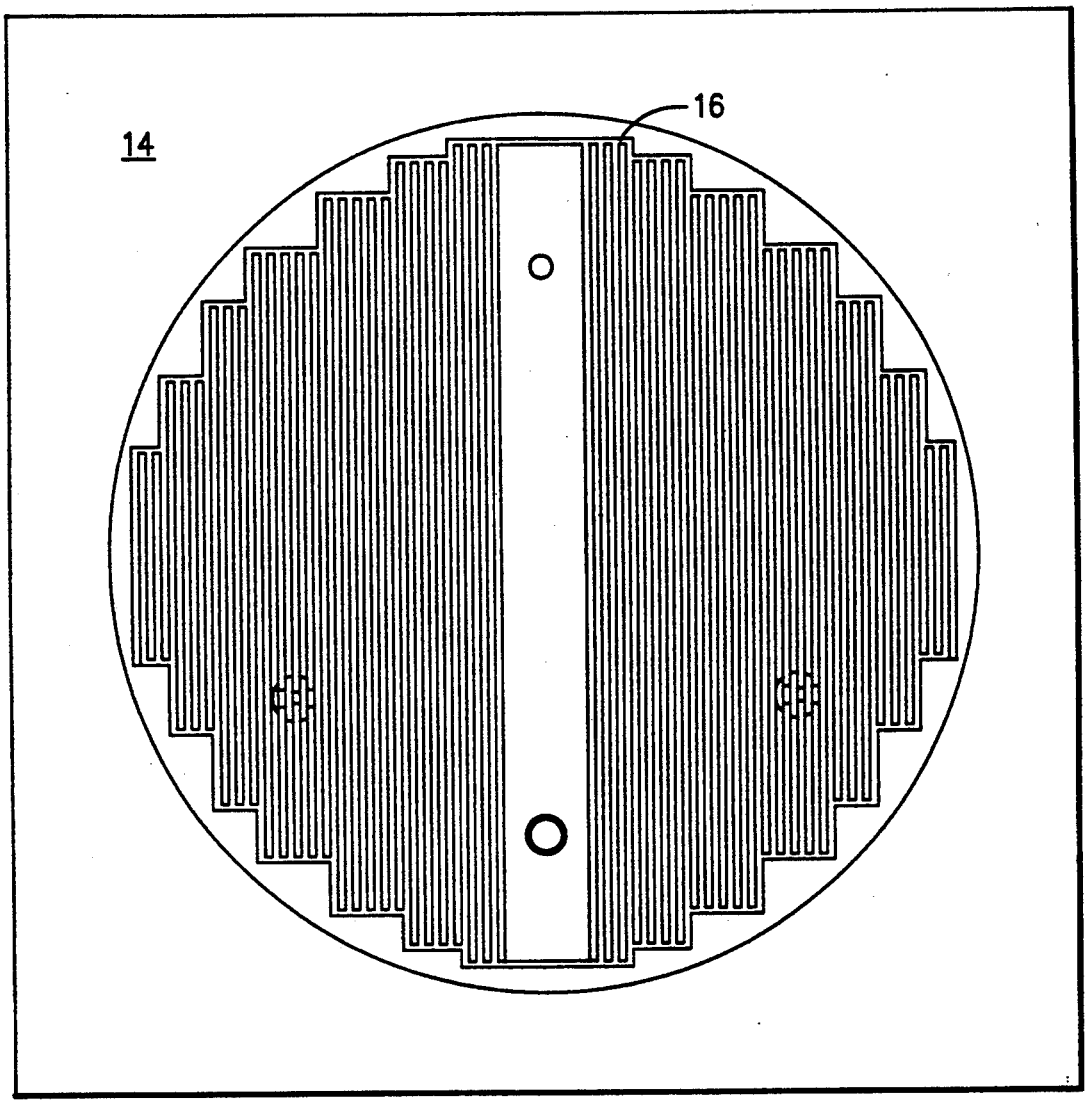
FIG. 3 is a top view of the metal pattern layer of the electrostatic chuck of the present invention.

Referring now to FIG. 3, the electrostatic conductive pattern 16 disposed on electrostatic pattern layer 12 is comprised of two equal areas of conductors formed in a symmetrically distributed pattern. It is preferable that the pattern 16 have a maximum amount of strips with minimum distance between strips, while maintaining an adequately thick isolation layer 10. The conductive material may be any of a number of conductive materials, as taught in the aforementioned MLC patents, in particular Ahn et al. and Herron et al. The material utilized, however, must have a thermal expansion rate similar to the electrostatic pattern layer substrate 14 material in order to avoid separation of the pattern from the substrate. For instance, molybdenum has been found to be a suitable material.

Figure 4:
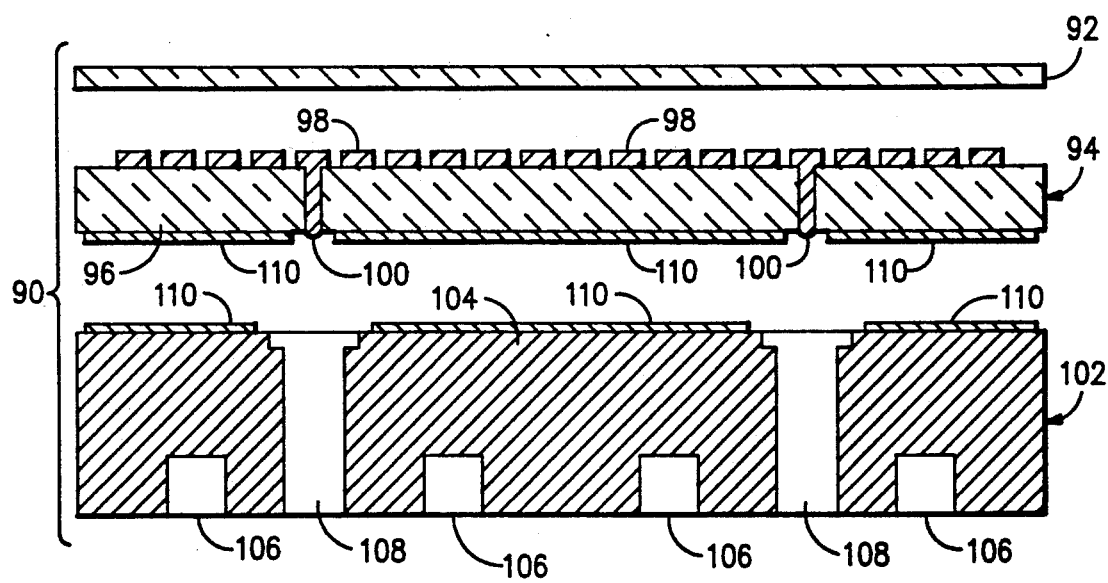
FIG. 4 is an exploded, cross-sectional view of a second embodiment of the electrostatic chuck of the present invention.

Referring now to FIG. 4, a second embodiment 90 of the electrostatic chuck of the present invention includes an isolation layer 92 disposed on an electrostatic pattern layer 94 comprised of a multilayer ceramic substrate 96 having a conductive electrostatic pattern 98 disposed thereon and conductive vias 100 extending therethrough which are connected to the electrostatic pattern 98. Layer 94 is disposed on a heat sink base 102 which is comprised of an iron/nickel/cobalt alloy (29Ni/17Co/53Fe) substrate 104 having cooling channels 106 machined therein for circulating a cooling liquid and clearance holes 108 extending therethrough for providing access to the conductive vias 100. Layers 94 and 92 are fabricated and bonded together utilizing the teachings of the aforementioned MLC patents. Layer 94 is brazed to heat sink base 102 by depositing gold contact pads 110 on the respective bonding surfaces, fitting the pieces together, and heating the assembly in a brazing furnace.

The aforementioned second embodiment is similar to the embodiment described and illustrated in FIG. 1 hereinbefore, with the only difference being that the electrostatic pattern layer 94 is thick enough that a multilayer support (reference numeral 20 of FIG. 1) is unnecessary. The layer 94 is therefore mechanically stable enough to be adequately bonded to the heat sink base 102.

Although the invention has been shown and described with exemplary embodiments thereof, it should be understood by those skilled in the art that the foregoing and other various changes, omissions and additions may be made therein and thereto without departing from the spirit and the scope of the invention.

What is claimed is:

1. An electrostatic chuck for clamping a semiconductor wafer comprising, from top to bottom:
    an electrically insulative, thermally conductive isolation layer;
    a multilayer ceramic electrostatic pattern layer having an electrically conductive pattern disposed thereon for generating an electrostatic force and having first electrically conductive vias disposed therethrough for conducting electrical energy to said conductive pattern;
    a multilayer ceramic support having second electrically conductive vias disposed therethrough for conducting electrical energy to said first vias; and,
    a heat sink base having access holes provided therethrough for providing access to said second vias.

2. An electrostatic chuck for clamping a semiconductor wafer according to claim 1, wherein said heat sink base further comprises cooling channels for circulating a coolant.

3. An electrostatic chuck for clamping a semiconductor wafer according to claim 1, wherein said isolation layer is comprised of multilayer ceramic.

4. An electrostatic chuck for clamping a semiconductor wafer according to claim 1, wherein said isolation layer is comprised of polyimide.

5. An electrostatic chuck for clamping a semiconductor wafer according to claim 1, wherein said isolation layer is comprised of alumina.

6. An electrostatic chuck for clamping a semiconductor wafer according to claim 1, wherein said isolation layer is comprised of quartz.

7. An electrostatic chuck for clamping a semiconductor wafer according to claim 1, wherein said isolation layer is comprised of diamond.

8. An electrostatic chuck for clamping a semiconductor wafer according to claim 1, wherein said electrically conductive pattern is comprised of a plurality of alternating conductive strips, each said conductive strip being electrically energized with an opposite DC potential of that of adjacent strips.

9. An electrostatic chuck for clamping a semiconductor wafer according to claim 1, wherein said electrically conductive pattern is comprised of molybdenum.

10. An electrostatic chuck for clamping a semiconductor wafer according to claim 1, wherein said isolation layer, electrostatic layer and support are bonded together by compression and heat.

11. An electrostatic chuck for clamping a semiconductor wafer according to claim 1, wherein said support and said heat sink base are brazed together.

12. An electrostatic chuck for clamping a semiconductor wafer according to claim 1, wherein said heat sink base is comprised of an iron/nickel/cobalt alloy.

13. An electrostatic chuck for clamping a semiconductor wafer according to claim 1, wherein said heat sink base is comprised of an iron/nickel/cobalt alloy (29Ni/17Co/53Fe).

14. An electrostatic chuck for clamping a semiconductor wafer comprising, from top to bottom:
    a multilayer ceramic isolation layer;
    a multilayer ceramic electrostatic layer having an electrically conductive pattern disposed thereon for generating an electrostatic force and conductive vias disposed therethrough for conducting electrical energy to said electrically conductive pattern; and,
    a heat sink base for supporting and cooling said isolation and electrostatic layers having access holes disposed therethrough for providing access to said conductive vias.

15. An electrostatic chuck for clamping a semiconductor wafer according to claim 14, wherein said heat sink base is comprised of an iron/nickel/cobalt alloy.

16. An electrostatic chuck for clamping a semiconductor wafer according to claim 14, wherein said heat sink base is further comprised of cooling channels disposed therein for circulating a coolant.

17. An electrostatic chuck for clamping a semiconductor wafer according to claim 14, wherein said isolation layer and said electrostatic layer are bonded together with heat and pressure.

18. An electrostatic chuck for clamping a semiconductor wafer according to claim 14, wherein said electrostatic layer is brazed to said heat sink base.

19. An electrostatic chuck for clamping a semiconductor wafer comprising, from top to bottom:
    a multilayer ceramic isolation layer;
    a multilayer ceramic electrostatic pattern layer having: an electrically conductive pattern disposed thereon for generating an electrostatic force and comprised of a plurality of alternating conductive strips, each said conductive strip being electrically energized with an opposite DC potential of that of adjacent strips; and, first electrically conductive vias disposed therethrough for conducting electrical energy to said conductive pattern;

a multilayer ceramic support having second electrically conductive vias disposed therethrough for conducting electrical energy to said first vias; and, a heat sink base comprised of an iron/nickel/cobalt alloy and having: access holes provided therethrough for providing access to said second vias; and, cooling channels disposed therein for circulating a coolant, wherein said isolation layer, electrostatic layer and support are bonded together by compression and heat and said support and said heat sink base are brazed together.

20. An electrostatic chuck for clamping a semiconductor wafer comprising, from top to bottom:

a multilayer ceramic isolation layer;

a multilayer ceramic electrostatic pattern layer having: an electrically conductive pattern disposed thereon for generating an electrostatic force and comprised of a plurality of alternating conductive strips, each said conductive strip being electrically energized with an opposite DC potential of that of adjacent strips; and, first electrically conductive vias disposed therethrough for conducting electrical energy to said conductive pattern; and, a heat sink base comprised of an iron/nickel/cobalt alloy and having: access holes provided therethrough for providing access to said first vias; and, cooling channels disposed therein for circulating a coolant, wherein said isolation layer and electrostatic layer are bonded together by compression and heat and said electrostatic layer and said heat sink base are brazed together.

* * * * *